US010816584B2

(12) United States Patent
Chen et al.

(10) Patent No.: US 10,816,584 B2
(45) Date of Patent: Oct. 27, 2020

(54) SPECTRUM EXTENSION EDGELESS GATING FOR REDUCED TIME DOMAIN GATING EDGE ERRORS

(71) Applicant: ETS-Lindgren Inc., Cedar Park, TX (US)

(72) Inventors: Zhong Chen, Cedar Park, TX (US); Zubiao Xiong, Cedar Park, TX (US)

(73) Assignee: ETS-Lindgren, Inc., Cedar Park, TX (US)

( * ) Notice: Subject to any disclaimer, the term of this patent is extended or adjusted under 35 U.S.C. 154(b) by 340 days.

(21) Appl. No.: 15/830,658

(22) Filed: Dec. 4, 2017

(65) Prior Publication Data

US 2019/0170797 A1 Jun. 6, 2019

(51) Int. Cl.
*G01R 27/28* (2006.01)
*G06F 17/17* (2006.01)
*G01R 27/32* (2006.01)

(52) U.S. Cl.
CPC .............. *G01R 27/28* (2013.01); *G06F 17/17* (2013.01); *G01R 27/32* (2013.01)

(58) Field of Classification Search
CPC .......... G01R 27/28; G01R 27/32; G06F 17/17
See application file for complete search history.

(56) References Cited

U.S. PATENT DOCUMENTS 5,337,016 A * 8/1994 Wozniak ............... G01R 27/32
  324/627
8,706,433 B2 * 4/2014 Pupalaikis ............ G01R 27/32
  702/66

OTHER PUBLICATIONS

Wubbeler et al., 'Determination of the Complex Residual Error Parameters of a Calibrated One-Port Vector Network Analyzer,' Sep. 2009, IEEE Pub, vol. 58, pp. 3238-3244 (Year: 2009).*
Dunsmore, Joel; Title: "Gating Effects in Time Domain Transforms"; ResearchGate Article dated Dec. 2008; http://www.researchgate.net/publication/251874462, consisting of 9-pages.
Gustaysen, et al.; IEEE Transactions on Power Delivery, vol. 14, No. 3; Title: "Rational Approximation of Frequency Domain Responses by Vector Fitting"; Jul. 1999, consisting of 10-pages.

(Continued)

*Primary Examiner* — Elias Desta
(74) *Attorney, Agent, or Firm* — Christopher & Weisberg, P.A.

(57) ABSTRACT

A method and system for processing finite frequency domain data to which a time gating process is to be applied to improve performance of signal processing equipment and to facilitate complex time gating while suppressing edge effects. According to one aspect, a method for improved processing of a finite frequency signal by signal processing equipment to suppress edge effects arising from a time gating process is provided. The method includes padding the finite frequency signal outside a frequency range with samples derived from an extrapolation process to produce an extended signal having samples inside and outside the frequency range of the finite signal. The method further includes applying a time gating process to the extended signal to exclude signals occurring outside a time interval and to produce a time gated signal with suppressed edge effects.

18 Claims, 11 Drawing Sheets

(56) References Cited

OTHER PUBLICATIONS

Adve, et al.; IEEE Transactions on Microwave Theory and Techniques, vol. 45, No. 5; Title: "Application of the Cauchy Method for Extrapolating/Interpolating Narrow-Band System Responses"; May 1997, consisting of 9-pages.
Narayana, et al.; Digital Processing 6, Article No. 006; dated 1996; Title: "A Comparison of Two Techniques for the Interpolation/Extrapolation of Frequency Domain Responses"; pp. 51-67, 1996, consisting of 17-pages.
Kauppinen, et al.; Proc. of the 5th Int. Conference on Digital Audio Effects (DAFx-02); Title: "Audio Signal Extrapolation—Theory and Applications"; Location and date: Hamburg, Germany, Sep. 26-28, 2002, consisting of 6-pages.
Cedrick Collomb; Title: "Burg's Method, Alogrithm and Recursion"; Nov. 8, 2009; http://ccollomb.free.fr/, consisting of 11-pages.

* cited by examiner

SPECTRUM EXTENSION EDGELESS GATING FOR REDUCED TIME DOMAIN GATING EDGE ERRORS

TECHNICAL FIELD

The present disclosure relates to a method and system for processing finite frequency domain data to which a time gating process is to be applied to improve performance of signal processing equipment and to facilitate complex time gating while suppressing edge effects.

BACKGROUND

Time domain gating is a common digital signal processing technique widely used in modern vector network analyzers (VNA) and other digital signal processing equipment. Typically, a set of measurement data, computer generated data, or other data, herein referred to as original frequency domain data, may be presented as a sequence of frequency domain samples versus frequency, The original frequency domain data may be transformed to the time domain via an Inverse Fourier Transform (IFT) to present a sequence of time domain samples versus time. This time domain sequence may then be gated by a time gate function to selectively exclude data from certain time periods which may contain, for example, unwanted reflections that are included in the original frequency domain data. The gated time domain sequence is then transformed back to the frequency domain via a forward Fourier transform to produce a processed frequency domain signal Typically, the original frequency domain data may be available only within a finite band; that is, the original frequency domain data is unknown below a first lower frequency and above a second higher frequency, with the frequency domain data of interest lying between the first and second frequencies. Because of the finite data set, the processed frequency domain data can show strong artifacts near the band edges arising from the mathematical process of time-gating.

Time domain gating is by definition the multiplication of the gate with the time domain response of the data in time domain. By Fourier theory, it is equivalent to convolution of the Fourier transform of the time gate function with the original frequency response data. Because of the lack of data at band edges in the original frequency response data, the data is assumed to be zero outside the frequency range of available data. The gate convolution is therefore performed over a function with the discontinuities at the two band edges, causing non-physical frequency response ripples near the band edges, commonly referred to as edge effects.

Edge effects can be mitigated by using several techniques. First, the original data may be multiplied by a window function, which is centered around the middle of the frequency band, and tapered down gradually near the band edges, such as Kaiser-Bessel window, Hanning window, and Hamming windows etc. The window is accounted for after the convolution by dividing the results by the same function.

Another technique is to apply a gate renormalization process based on a unit function. Assume the data is a constant unit response in the frequency domain, i.e., magnitude of 1 inside the frequency range of interest, and zero outside. The unit response has a phase term of $e^{-j\omega T_c}$ such that its time domain response is centered around Tc (where Tc is the gate center). The unit response data goes through the same process as the original data, i.e., first multiplied by the windowing function, and then filtered by the gate kernel. The data is finally divided by the same windowing function. An example of the resulting edge renormalization function is shown in FIG. 1.

The renormalization function is divided by the gated data. As can be easily understood, a unit function will be perfectly restored using this process, and there is no error in this case. For other actual measurement data, there will be artifacts from this process. In fact, the uncertainties at band edges can be quite significant, e.g., on the order of 1 dB. FIG. 2 summarizes the entire time domain gating process and normalization process implemented in a typical vector network analyzer. It is noted that the linear filtering process shown in FIG. 2 is mathematically equivalent to zero-padding the original data beyond the edges in the frequency domain.

If time domain gates with multiple passbands or stopbands are needed, the edge renormalization scheme described above cannot be applied easily. This is because the unit function corresponds to a single time pulse in the time domain. It is not obvious how a filter with multiple gates can be matched to a single pulse.

SUMMARY

The present invention advantageously provides a method and system for processing finite frequency domain data to which a time gating process is to be applied to improve performance of signal processing equipment and to facilitate complex time gating while suppressing edge effects. In some embodiments, a method for improved processing of a finite frequency signal by signal processing equipment to suppress edge effects arising from a time gating process is provided. The method includes padding the finite signal outside a frequency range of the finite signal with samples derived from an extrapolation process to produce an extended signal having samples inside and outside the frequency range of the finite signal. The method further includes applying a time gating process to the extended signal to exclude signals occurring outside a time interval and to produce a time gated signal with suppressed edge effects.

BRIEF DESCRIPTION OF THE DRAWINGS

A more complete understanding of the present invention, and the attendant advantages and features thereof, will be more readily understood by reference to the following detailed description when considered in conjunction with the accompanying drawings wherein.

DETAILED DESCRIPTION

Figure 1:
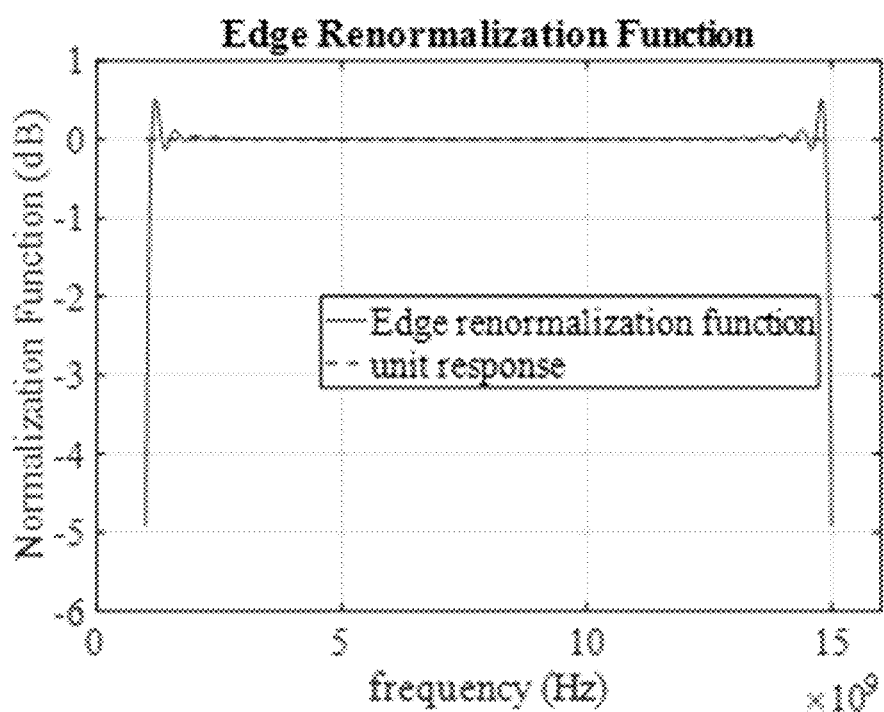
FIG. 1 is an example of a resulting edge renormalization function.

Before describing in detail exemplary embodiments, it is noted that the embodiments reside primarily in combinations of apparatus components and processing steps related to processing finite frequency domain data to which a time gating process is to be applied to improve performance of signal processing equipment and to facilitate complex time gating while suppressing edge effects. Accordingly, components have been represented where appropriate by conventional symbols in the drawings, showing only those specific details that are pertinent to understanding the embodiments so as not to obscure the disclosure with details that will be readily apparent to those of ordinary skill in the art having the benefit of the description herein.

As used herein, relational terms, such as "first" and "second," "top" and "bottom," and the like, may be used solely to distinguish one entity or element from another entity or element without necessarily requiring or implying any physical or logical relationship or order between such entities or elements. The terminology used herein is for the purpose of describing particular embodiments only and is not intended to be limiting of the concepts described herein. As used herein, the singular forms "a", "an" and "the" are intended to include the plural forms as well, unless the context clearly indicates otherwise. It will be further understood that the terms "comprises," "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein. In embodiments described herein, the joining term, "in communication with" and the like, may be used to indicate electrical or data communication, which may be accomplished by physical contact, induction, electromagnetic radiation, radio signaling, infrared signaling or optical signaling, for example. One having ordinary skill in the art will appreciate that multiple components may interoperate and modifications and variations are possible of achieving the electrical and data communication.

Note also that the terms "data," "samples," and "signals" may be used interchangeably since the data, samples or signals are discrete within the signal processing equipment.

Embodiments provide a spectrum extension edgeless gating system (SEEG) that improves the performance of signal processing equipment and that enables complex time gating with minimal distortion manifested in the frequency domain. The system comprises signal processing equipment to process original frequency domain data that is, or can be, known in a finite frequency range. The finite frequency signal has an in-band region between a lower frequency and an upper frequency where useful signal information is present. The finite frequency signal has a lower out-of-band region below the lower frequency and has an upper out-of-band region above the upper frequency. The lower and upper out-of-band regions have no signal information or have signal information that can be neglected.

The finite frequency domain signal may be extended below the lower frequency edge of the band of the finite signal and may be extended above the upper frequency edge of the band of the finite signal. The finite frequency signal may therefore be padded outside the frequency range of the finite signal with samples derived from an extrapolation process to produce an extended signal having samples inside and outside the frequency range of the finite signal. In particular, the lower out-of-band region can be filled at least in part by samples derived directly or indirectly from the in-band information of the finite signal. Likewise, the upper out-of-band region can be filled at least in part by samples derived directly or indirectly from the in-band information of the finite signal. The filling or partial filling of the out-of-band regions based on in-band information may be referred to as padding or extending the finite frequency signal to produce an extended signal.

Several methods that may be used for the extension process may include Vector Fitting (VF), the Cauchy method, matrix pencil method and Hilbert transform extrapolation method. These methods are known to persons having skill in the art of signal processing. For example, the VF and Cauchy methods obtain the out-of-band samples based on rational functions. The Hilbert transform extrapolation method is based on the fact that, for causal signals, the real and imaginary parts of the signal are related by the Hilbert transform. The Hilbert transform extrapolation method involves iterative computing between the real and imaginary parts until the extension data is causal. Such methods may be computationally intensive which may not be acceptable for some applications.

An alternative method applies an autoregressive (AR) model to the spectral data of the finite frequency domain signal to obtain the extended frequency domain signal. This method is less computationally intensive than some other methods, thereby improving the performance of signal processing equipment even further and increasing the feasibility of complex time gating of data. One may postulate that the out-of-band data to be provided is correlated to the in-band signal. For some data, such as data resulting from a measurement of two antennas, for example, one may assume that a certain autocorrelation bandwidth exists. In the AR modeling method, which is one possible solution to the Hilbert transform extrapolation method, the causal requirement is met because the predicted data to be applied to the out-of-band regions of the finite signal is a linear weighted combination of the in-band data of the finite signal. One particular AR technique is known as Burg's AR, which aims to minimize a sum of a forward squared residue and a backwards squared residue. A Matlab algorithm for this method exists in the literature and may be implement via the following code:

```
a=arburg(data,order);
Z=filtic(1,a,data(end-(0:(order−1))));
extended=filter(1,a,zero s(1,extendlength),Z).';
``` where 'data' is a vector containing the known signal (the in-band data), 'order' is the length of the impulse response, and the vector 'extended' is the extrapolated data (the out-of-band data) with a length of 'extendlength'. See, Ismo Kauppinen and Kari Roth, "Audio Signal Extrapolation—Theory and Applications", Proc. of the 5th Conference on Digital Audio Effects (DAFx-02), Hamburg, Germany, 2002.

Figure 3:
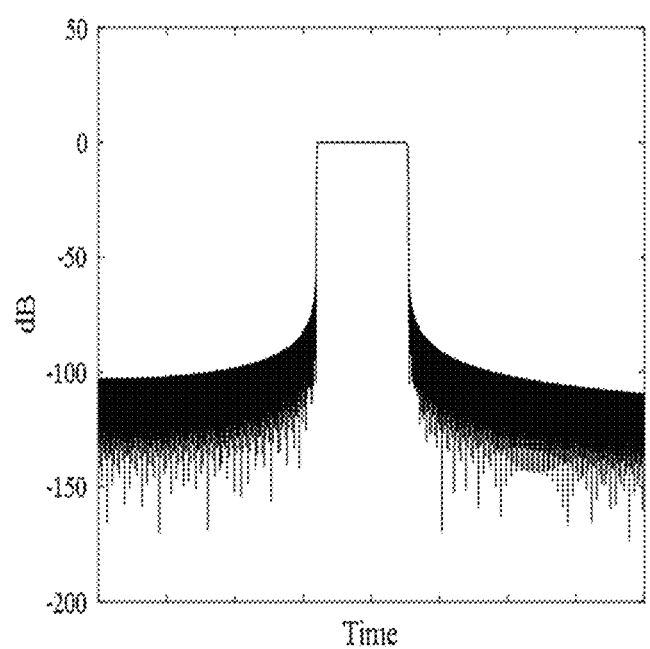
FIGS. 3 and 4 are examples of time gate functions.
Figure 4:
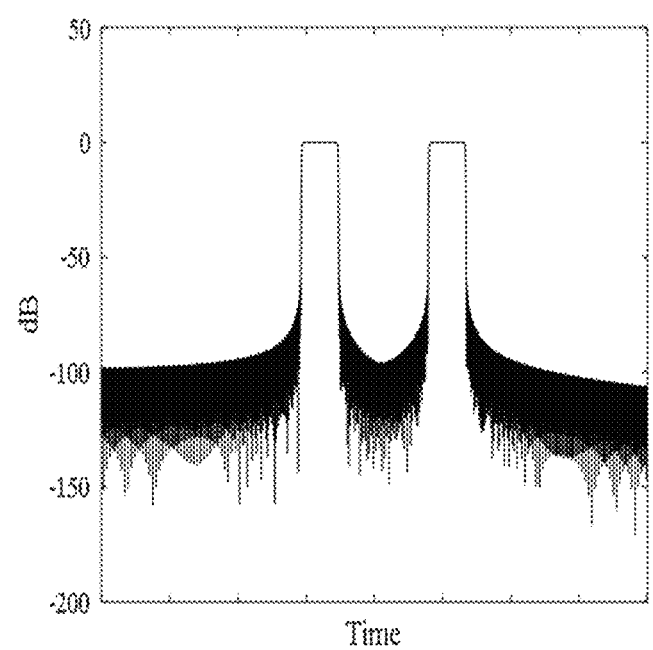

Since these methods of extrapolation do not require a renormalization process as described above, they can be used in situations where multiple time gates, such as the time gate of FIG. 3, are used, for example, to filter out data extending below a first starting point in time (region x) and to filter out data extending above a second starting point in time (region y). As another example of a time gate function which also suppresses data occurring between two times (region z), see FIG. 4. Thus, embodiments described herein may expand the capabilities of existing time gating processes, enabling more complex time gating analysis.

Figure 5:
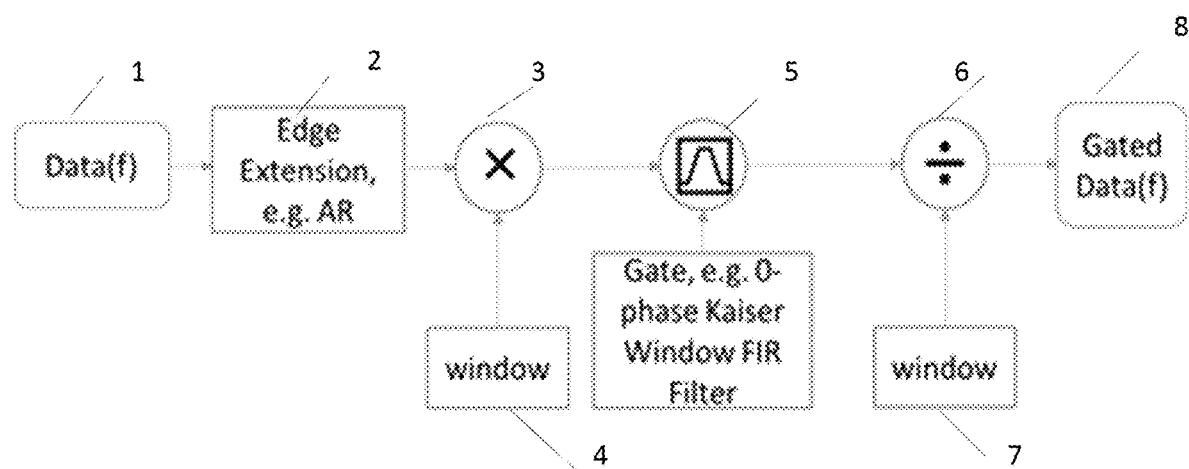
FIG. 5 shows an exemplary process for processing finite frequency signals by signal processing equipment to suppress edge effects arising from a time gating process.

A flow diagram of an exemplary process for processing finite frequency signals by signal processing equipment to suppress edge effects arising from a time gating process is shown in FIG. 5. The process begins with finite frequency domain data 1. Note that the finite frequency data may be obtained by a previously-performed measurement process, for example, that provides a frequency response of a device under test (DUT) between an upper and lower frequency. As another example, a collection of data may be truncated prior to beginning the process of FIG. 5. An edge extension algorithm 2, such as the ones described above, is applied to the finite frequency data 1 to produce extended data, also referred to as an extended signal. The extended signal is multiplied via the multiplier 3 by a window function 4 to produce a windowed extended signal. The windowed extended signal is subjected to a time gating process 5 to produce a time gated windowed extended signal. This time gating process may be performed in the time domain by multiplication by a filter such as the filter shown in FIG. 3 or 4, for example. In the alternative, the time gating process may be performed in the frequency domain by the operation of convolution, because, as is known by persons having ordinary skill in the art, multiplication in the time domain is equivalent to convolution in the frequency domain. The time gated windowed extended signal is divided at a multiplier 6 by a window 7 to produce the time gated data 8.

Figure 6:
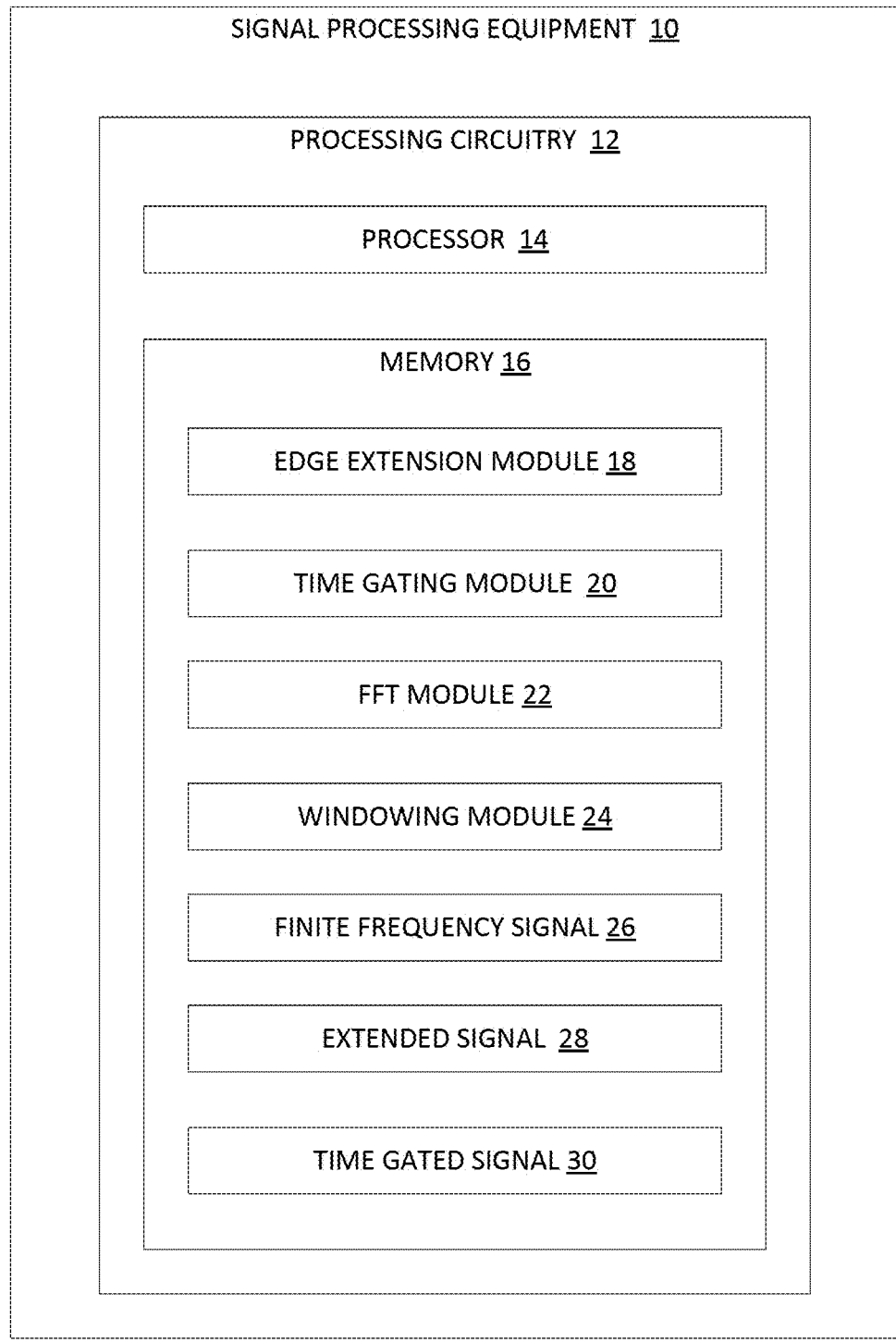
FIG. 6 is a simplified block diagram of a signal processing equipment (SPE) configured to perform a spectrum extension edgeless gating system (SEEG), as described herein.

A simplified block diagram of a signal processing equipment (SPE) 10 configured to perform a spectrum extension edgeless gating system (SEEG), as described herein, is shown in FIG. 6. The SPE 10 may be a network analyzer, computer or other signal processing equipment. The SPE 10 has processing circuitry 12 configured to extend a finite frequency signal and time gate the extended signal as discussed above, and here below. In some embodiments, the processing circuitry may include a processor 18 and memory 16, the memory 16 including computer code, which may be organized into modules, that when executed by the processor 18, cause the processor to perform data extension and time gate functions described herein.

Thus, the memory 16 may include software modules such as, for example, an edge extension module 18 configured to pad the finite frequency signal 26 with samples placed outside a frequency range of the finite signal to produce an extended signal 28, the samples being derived from an extrapolation process. A time gating module 20 may be configured to time gate the extended signal 28 to produce a time gated signal 30. The time gated signal 30 may have reduced edge effects, regardless of the complexity of the applied time gate, by virtue of the extrapolation process (also called the extension process) applied to the finite frequency signal 26. The time gating module 20 may apply time gating to the extended signal in the frequency domain by taking the Fast Fourier Transform (FFT) of the time gating signal, or in the time domain by applying an inverse FFT to the extended signal, via the FFT module 22. A windowing module 24 may be included to perform the windowing 4, 7 described above with reference to FIG. 5.

Figure 7:
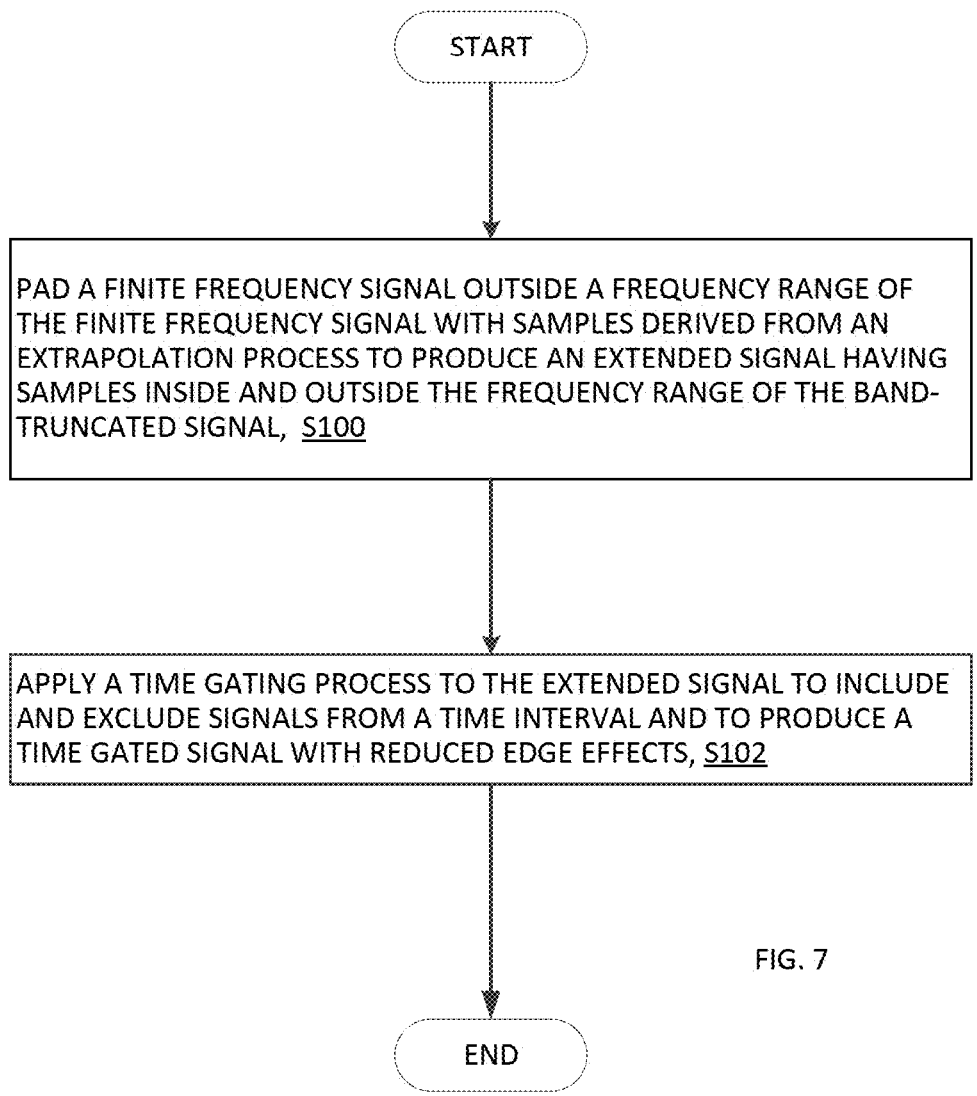
FIG. 7 is a flowchart of an exemplary process for processing a finite frequency signal to reduce edge effects arising from a time gating process within signal processing equipment.

FIG. 7 is a flowchart of an exemplary process for processing a finite frequency signal to reduce edge effects arising from a time gating process within signal processing equipment. The process includes padding the finite signal outside a frequency range of the finite signal with samples derived from an extrapolation process to produce an extended signal having samples inside and outside the frequency range of the finite signal (block S100). The process also includes applying a time gating process to the extended signal to include and exclude signals from a time interval and to produce a time gated signal with reduced edge effects (block S102).

Figure 8:
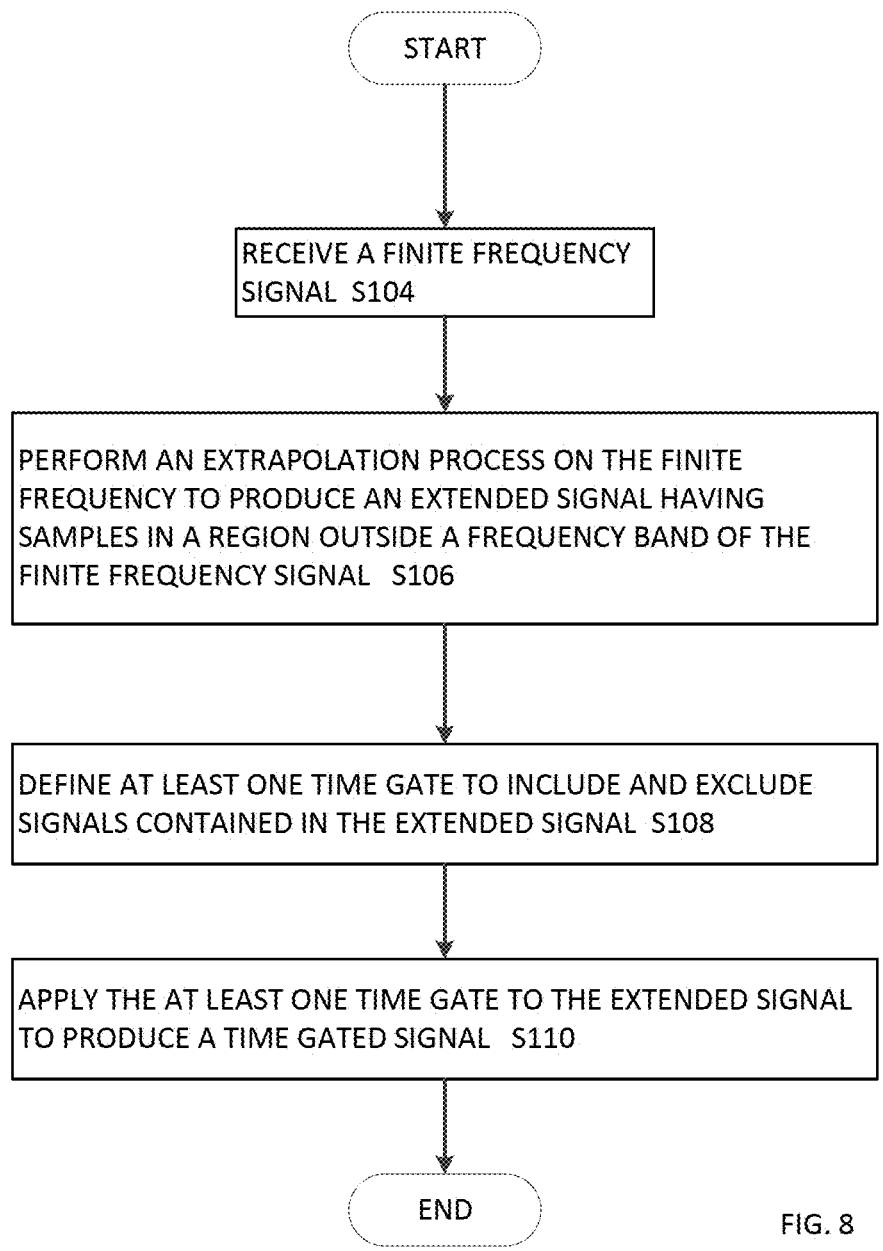
FIG. 8 is a flowchart of an exemplary process for processing a finite frequency signal by signal processing equipment to reduce edge effects arising from a time gating process.

FIG. 8 is a flowchart of an exemplary process for processing a finite frequency signal by signal processing equipment to reduce edge effects arising from a time gating process. The process includes receiving a finite frequency signal (block S104). The process also includes performing an extrapolation process on the finite frequency signal to produce an extended signal having samples in a region outside a frequency band of the finite frequency signal (block S106). The process further includes defining at least one time gate to include and exclude signals contained in the extended signal (block S108). The process also includes applying the at least one time gate to the extended signal to produce a time gated signal with substantially no edge effects (block S110).

Figure 9:
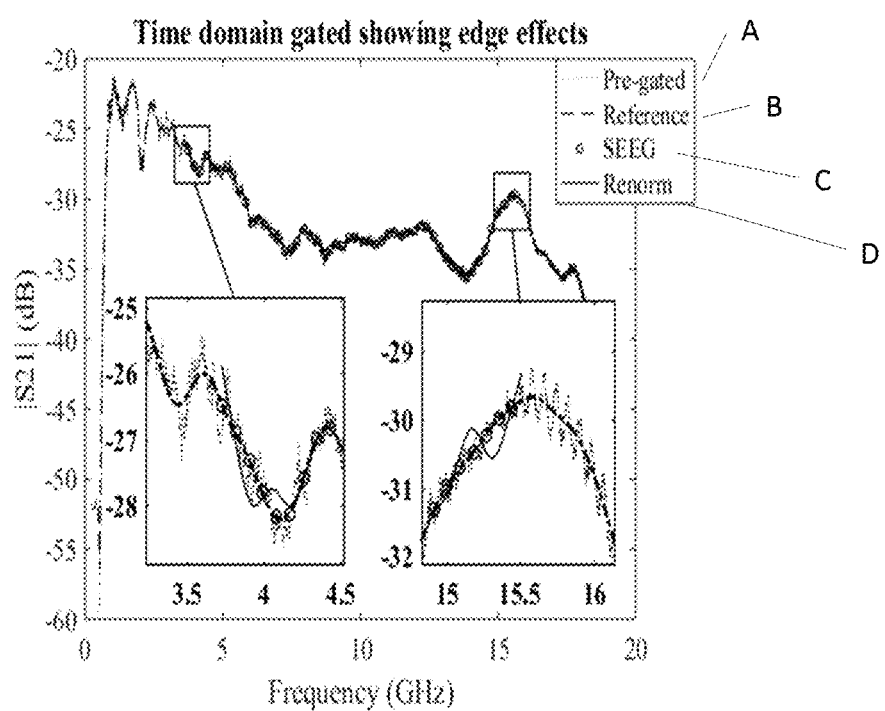
FIG. 9 is a graph of the $S_{21}$ frequency response between two broadband double ridged guide (DRG) horn antennas.

FIG. 9 is a graph of the $S_{21}$ frequency response between two broadband double ridged guide (DRG) horn antennas. Line A is the original data without time domain gating. Line B shows is a reference signal that is obtained from the data of Line A that is sufficiently far from an edge. Line C shows the result of applying the method described herein (SEEG). Line D is the result of application of the known renormalization process described above.

Figure 10:
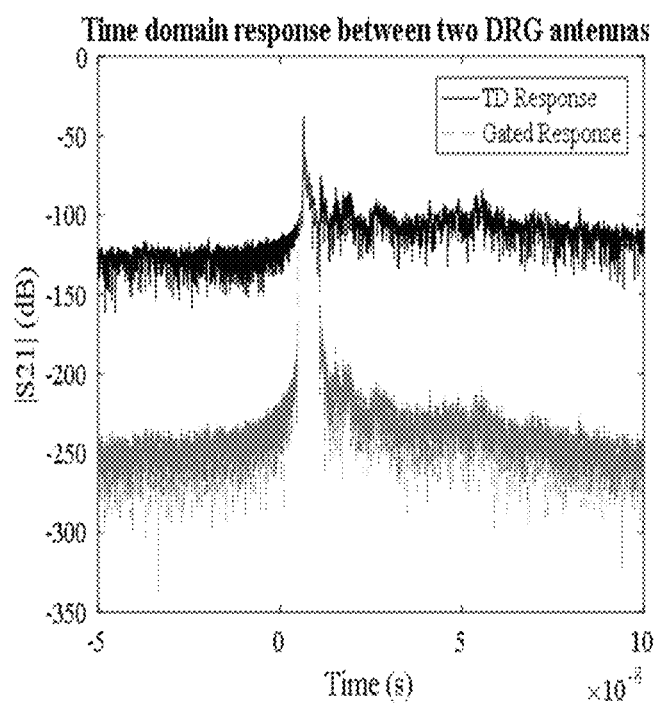
FIG. 10 shows a time domain response corresponding to Line C, obtained by using the inverse Chirp-Z transform.

FIG. 10 shows a time domain response corresponding to Line C, obtained by using the inverse Chirp-Z transform. The frequency response is collected from 400 MHz to 19 GHz. The gating analysis is performed without the renormalization treatment; therefore, there are considerable edge effects (even though a pre-gating Kaiser-Bessel Window of order 6 is applied). Next, the data is truncated to include 3.6-15.5 GHz. We can apply the gating algorithms on the truncated data. Since the edges 3.6 GHz and 15.5 GHz are far away from the edge, we can consider the gated results over the pre-truncation data to be free from edge effects. It is used as the reference data.

Figure 2:
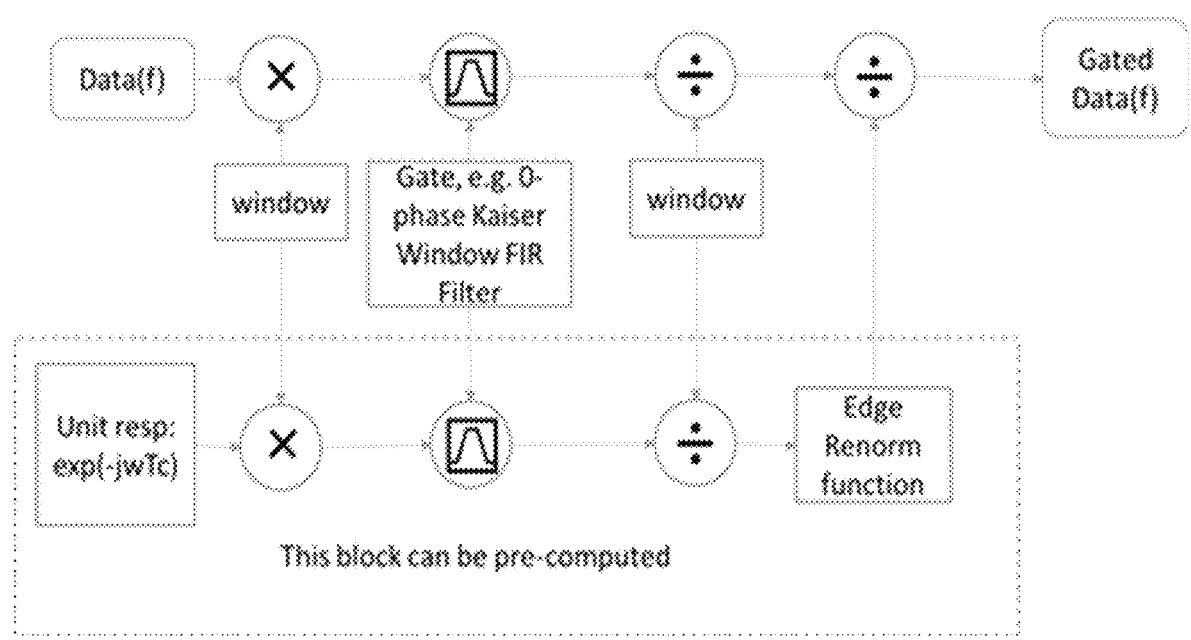
FIG. 2 summarizes an entire time domain gating process and normalization process according to known methods.
Figure 11:
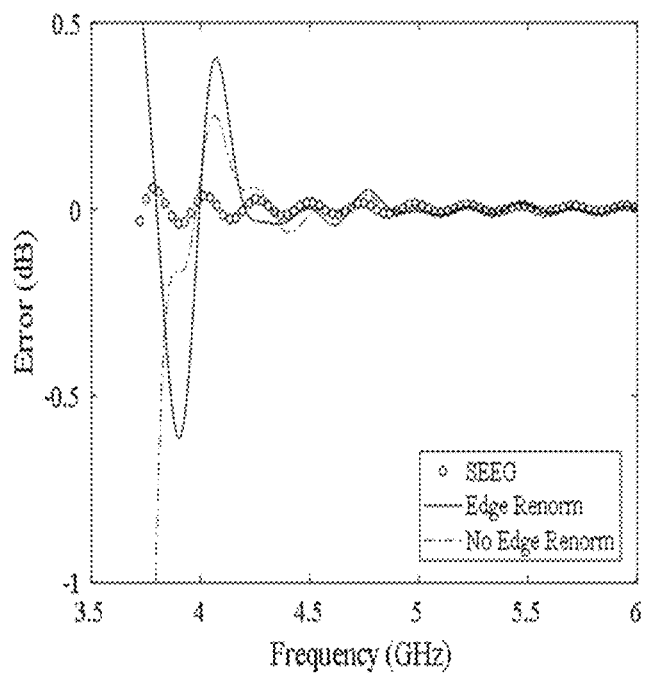
FIG. 11 shows the errors due to the edge effects for both methods at the lower edge.
Figure 12:
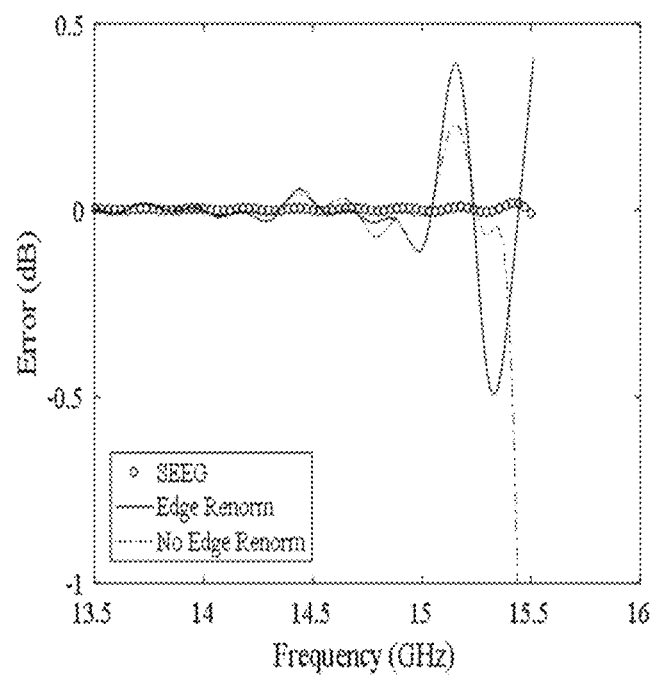
FIG. 12 shows the errors due to the edge effects for both methods at the upper edge.

Time domain gating is applied over the truncated data (below 15.5 GHz) using both the procedure shown in FIG. 2 (edge renormalization) and FIG. 5 (SEEG). In both cases, a Kaiser-Bessel windowing function of order 6 is used to pre-treat the data. The SEEG method uses the Burg's AR model to extend the spectrum data. FIG. 11 shows the errors due to the edge effects for both methods at the lower edge. FIG. 12 shows the errors due to the edge effects for both methods at the upper edge. FIGS. 11 and 13 also shows results using the procedure of FIG. 2, but without any edge renormalization. It demonstrates the superior performance of the SEEG method.

In summary, the Spectrum Extension Edgeless Gating (SEEG) method reduces errors significantly at the band edges for time domain gating applications. Spectrum data is first extended, using for example, an autoregressive (AR) model, Vector Fitting, Cauchy method, a matrix pencil method, a Hilbert transform extrapolation method, etc. A time gate filter of any desired complexity is then applied over the spectrally extended data. Edge effects are reduced because of the removal of discontinuities at the edges. An example is given showing the SEEG method using Burg's AR model. The extended data using AR is intrinsically causal. In this example, the edge effect is reduced to less than +/−0.05 dB from +/−0.6 dB (comparing to the commonly used edge renormalization method [1]). In addition, the SEEG method can be applied easily in the case of multiple time domain gates. This provides a greater flexibility for time domain gating analyses.

Thus, in some embodiments, a method for improved processing of a finite frequency signal by signal processing equipment to suppress edge effects arising from a time gating process is provided. The method includes padding the finite frequency signal outside a frequency range of the finite signal with samples derived from an extrapolation process to produce an extended signal having samples inside and outside the frequency range of the finite signal. The method further includes applying a time gating process to the extended signal to exclude signals occurring outside a time interval and to produce a time gated signal with suppressed edge effects.

In some embodiments, the extrapolation process includes one of an autoregressive model, vector fitting, Cauchy method, matrix pencil method and Hilbert transform extrapolation method. In some embodiments, the time gating process is performed in the time domain upon an Inverse Fourier Transform, IFT, of the extended signal. In some embodiments, the time gating process is performed as a convolution of the extended signal with a Fourier transform of a time gate function in a frequency domain. In some embodiments, the method further includes applying a window function to the extended signal prior to applying the time gating process. In some embodiments, the time gating process includes and excludes signals in a plurality of separate time intervals. In some embodiments, the processing is performed without a renormalization process. In some embodiments, the signal processing equipment is a network analyzer.

In some embodiments, signal processing equipment for processing a finite frequency signal to suppress edge effects arising from a time gating process within the equipment is provided. The equipment includes processing circuitry configured to: pad the finite frequency signal with samples placed outside a frequency range of the finite signal to produce an extended signal, the samples being derived from an extrapolation process; and apply a time gating process to the extended signal to exclude signals occurring outside a time interval and to produce a time gated signal with suppressed edge effects.

In some embodiments, a method for improved processing of a finite frequency signal by signal processing equipment to suppress edge effects arising from a time gating process is provided. The method includes receiving a finite signal having a frequency band extending from a lower frequency to an upper frequency. The method further includes performing an extrapolation process on the finite frequency signal to produce an extended signal having samples in a region outside the frequency band of the finite signal. The method also includes defining at least one time gate to exclude signals contained in the extended signal that occur outside a time interval. The method further includes applying the at least one time gate to the extended signal to produce a time gated signal. In some embodiments, the method further includes displaying the time gated signal in a frequency domain. In some embodiments, the applying is performed in a time domain.

As will be appreciated by one of skill in the art, the concepts described herein may be embodied as a method, data processing system, and/or computer program product. Accordingly, the concepts described herein may take the form of an entirely hardware embodiment, an entirely software embodiment or an embodiment combining software and hardware aspects all generally referred to herein as a "circuit" or "module." Furthermore, the disclosure may take the form of a computer program product on a tangible computer usable storage medium having computer program code embodied in the medium that can be executed by a computer. Any suitable tangible computer readable medium may be utilized including hard disks, CD-ROMs, electronic storage devices, optical storage devices, or magnetic storage devices.

Some embodiments are described herein with reference to flowchart illustrations and/or block diagrams of methods, systems and computer program products. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer (to thereby create a special purpose computer), special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable memory or storage medium that can direct a computer or other programmable data processing apparatus to function in a particular manner, such that the instructions stored in the computer readable memory produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide steps for implementing the functions/acts specified in the flowchart and/or block diagram block or blocks.

It is to be understood that the functions/acts noted in the blocks may occur out of the order noted in the operational illustrations. For example, two blocks shown in succession may in fact be executed substantially concurrently or the blocks may sometimes be executed in the reverse order, depending upon the functionality/acts involved. Although some of the diagrams include arrows on communication paths to show a primary direction of communication, it is to be understood that communication may occur in the opposite direction to the depicted arrows.

Computer program code for carrying out operations of the concepts described herein may be written in an object oriented programming language such as Java® or C++. However, the computer program code for carrying out operations of the disclosure may also be written in conventional procedural programming languages, such as the "C"

or matlab programming language. The program code may execute entirely on the user's computer, partly on the user's computer, as a stand-alone software package, partly on the user's computer and partly on a remote computer or entirely on the remote computer. In the latter scenario, the remote computer may be connected to the user's computer through a local area network (LAN) or a wide area network (WAN), or the connection may be made to an external computer (for example, through the Internet using an Internet Service Provider).

Many different embodiments have been disclosed herein, in connection with the above description and the drawings. It will be understood that it would be unduly repetitious and obfuscating to literally describe and illustrate every combination and subcombination of these embodiments. Accordingly, all embodiments can be combined in any way and/or combination, and the present specification, including the drawings, shall be construed to constitute a complete written description of all combinations and subcombinations of the embodiments described herein, and of the manner and process of making and using them, and shall support claims to any such combination or subcombination. It will be appreciated by persons skilled in the art that the present invention is not limited to what has been particularly shown and described herein above. In addition, unless mention was made above to the contrary, it should be noted that all of the accompanying drawings are not to scale. A variety of modifications and variations are possible in light of the above teachings without departing from the scope of the following claims.

What is claimed is:

1. A method for improved processing of a finite frequency signal by signal processing equipment to suppress edge effects arising from a time gating process, the method comprising:
    padding the finite frequency signal outside a frequency range of the finite frequency signal with samples derived from an extrapolation process to produce an extended signal having samples inside and outside the frequency range of the finite frequency signal, the extrapolation process including iteratively computing the extended signal based jointly on the real and imaginary parts of the finite frequency signal until the extension signal is causal; and
    applying a time gating process to the extended signal to exclude signals occurring outside a time interval and to produce a time gated signal with suppressed edge effects.

2. The method of claim 1, wherein the extrapolation process includes one of an autoregressive model, vector fitting, Cauchy method, matrix pencil method and Hilbert transform extrapolation method.

3. The method of claim 1, wherein the time gating process is performed in the time domain upon an Inverse Fourier Transform, IFT, of the extended signal.

4. The method of claim 1, wherein the time gating process is performed as a convolution of the extended signal with a Fourier transform of a time gate function in a frequency domain.

5. The method of claim 1, further comprising applying a window function to the extended signal prior to applying the time gating process.

6. The method of claim 1, wherein the time gating process includes and excludes signals in a plurality of separate time intervals.

7. The method of claim 1, wherein the processing is performed without a renormalization process.

8. The method of claim 1, wherein the signal processing equipment is a network analyzer.

9. Signal processing equipment for processing a finite frequency signal to suppress edge effects arising from a time gating process within the equipment, the equipment comprising:
    processing circuitry configured to:
        pad the finite frequency signal with samples placed outside a frequency range of the finite frequency signal to produce an extended signal, the samples being derived from an extrapolation process, the extrapolation process including iteratively computing the extended signal based jointly on the real and imaginary parts of the finite frequency signal until the extension signal is causal; and
        apply a time gating process to the extended signal to exclude signals occurring outside a time interval and to produce a time gated signal with suppressed edge effects.

10. The equipment of claim 9, wherein the extrapolation process includes one of an autoregressive model, vector fitting, Cauchy method, matrix pencil method and Hilbert transform extrapolation method.

11. The equipment of claim 9, wherein the time gating process is performed in the time domain upon an Inverse Fourier Transform, IFT, of the extended signal.

12. The equipment of claim 9, wherein the time gating process is performed as a convolution of the extended signal with a Fourier transform of a time gate function in a frequency domain.

13. The equipment of claim 9, further comprising applying a window function to the extended signal prior to applying the time gating process.

14. The equipment of claim 9, wherein the time gating process includes signals and excludes signals from a plurality of separate time intervals.

15. The equipment of claim 9, wherein the processing is performed without a renormalization process.

16. A method for improved processing of a finite frequency signal by signal processing equipment to suppress edge effects arising from a time gating process, the method comprising:
    receiving a finite frequency signal having a frequency band extending from a lower frequency to an upper frequency;
    performing an extrapolation process on the finite frequency signal to produce an extended signal having samples in a region outside the frequency band of the finite frequency signal, the extrapolation process including iteratively computing the extended signal based jointly on the real and imaginary parts of the finite frequency signal until the extension signal is causal;
    defining at least one time gate to exclude signals contained in the extended signal that occur outside a time interval; and
    applying the at least one time gate to the extended signal to produce a time gated signal.

17. The method of claim 16, further comprising displaying the time gated signal in a frequency domain.

18. The method of claim 16, wherein the applying is performed in a time domain.

* * * * *